April 27, 1971 JEAN-CLAUDE FROUIN ET AL 3,576,682

METHOD OF MAKING COMPLEMENTARY TRANSISTORS
IN MONOLITHIC INTEGRATED CIRCUIT

Filed Feb. 5, 1968 2 Sheets-Sheet 1

INVENTORS

JEAN-CLAUDE FROUIN
MICHEL DE BREBISSON

BY [signature]

AGENT

INVENTORS
JEAN-CLAUDE FROUIN
MICHEL DE BREBISSON

BY [signature]
AGENT

United States Patent Office 3,576,682

Patented Apr. 27, 1971

3,576,682

METHOD OF MAKING COMPLEMENTARY TRANSISTORS IN MONOLITHIC INTEGRATED CIRCUIT

Jean-Claude Frouin and Michel de Brebisson, Caen, France, assignors to U.S. Philips Corporation, New York, N.Y.

Filed Feb. 5, 1968, Ser. No. 703,024
Claims priority, application France, Feb. 7, 1967, 93,983
Int. Cl. H01l 7/64
U.S. Cl. 148—175 7 Claims

ABSTRACT OF THE DISCLOSURE

A method is described of making a monolithic IC with complementary transistors wherein the p-emitter of the pnp transistor is diffused simultaneously with the p-isolation walls, followed by simultaneous diffusion of the p-base of the npn transistor and the p-collector of the pnp transistor, followed by simultaneous diffusion of the n-emitter for the npn transistor and the n-contact regions for the npn-collector and the pnp-base.

Figure 1:
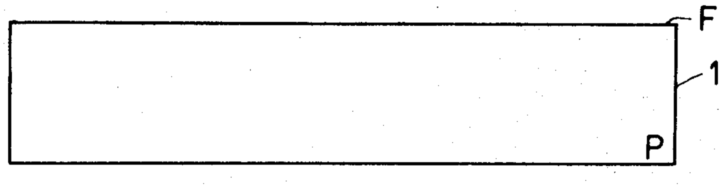
Figure 2:
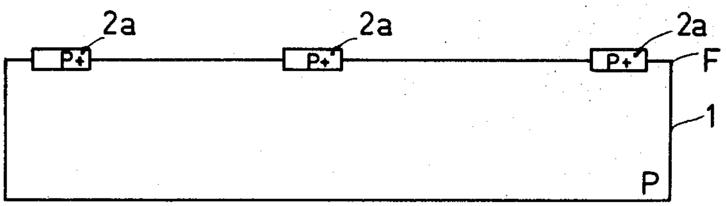
Figure 3:
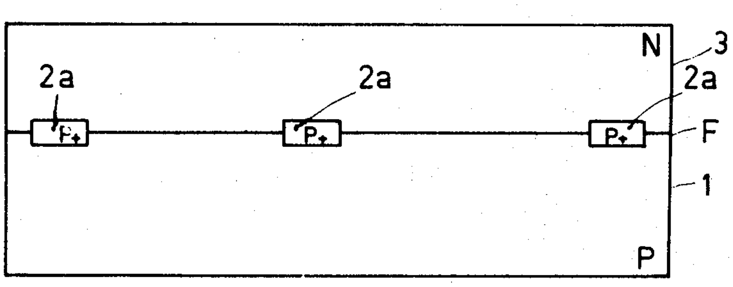

The invention relates to a method of manufacturing a monolithic integrated semiconductor device having a semiconductor body comprising islands which are electrically separated from each other by diffused isolating regions of a conductivity type which is opposite to that of the said islands, a first transistor having a diffused base and a diffused emitter being formed in at least one island, a second transistor which is of the type complementary to that of the first transistor and has a diffused emitter and a diffused collector being formed in at least one other island. A second transistor is said to be of a complementary type to the first transistor, if the first transistor is an npn-transistor (or a pnp-transistor) and the second transistor is a pnp-transistor (or an npn-transistor). The islands are usually obtained by providing diffused isolation regions of the same conductivity type as the substrate in an epitaxial layer provided on a substrate, the epitaxial layer being of the opposite conductivity type.

The isolation regions are usually considerably doped which is denoted by the addition of the plus symbol to the letter which denotes the conductivity type, p+ or n+.

In manufacturing integrated semiconductor devices, npn- or pnp-transistor structures can be provided in a simple manner, but the manufacture of integrated devices having at least one pnp-transistor presents considerable difficulties.

In French patent specification 1,404,680 a semiconductor device is described having two transistors which are of the complementary type relative to each other, the first transistor comprising a diffused base and emitter and the second transistor comprising a diffused emitter and collector, said diffused collector being annular so as to surround the emitter of the said second transistor.

In this known method, the two islands which each comprise one of the transistors are separated by an isolation diffusion, subsequently three regions of a conductivity type which is opposite to that of the islands in the islands are diffused, which three regions are to form the base of the first transistor and the collector and the emitter of the second transistor. In a third operation the emitter of the first transistor and the contact electrodes are formed.

Since the emitter and collector of the second transistor consist of diffused surface regions obtained in the same manner, the second transistor shows a small gain.

It is the object of the invention to provide a method in which a transistor having a diffused emitter and collector can be obtained with a better gain.

The invention is based on the recognition of the fact that it is possible to obtain a transistor having a diffused emitter and collector, the emitter being doped higher than the collector without introducing an additional process step.

According to the invention, a method of the type mentioned in the preamble is characterized in that the diffusion treatments to obtain the said isolation regions and to obtain the emitter of the second transistor are carried out simultaneously, after which the diffusion treatments to obtain the base of the first transistor and to obtain the collector of the second transistor and the diffusion treatments to obtain the emitter and the collector contact of the first transistor and of the base contact of the second transistor are carried out.

The base of the first transistor and the collector of the second transistor are preferably provided simultaneously and this is also the case with the emitter and the collector contact of the first transistor and the base contact of the second transistor.

The islands of the integrated semiconductor device are preferably formed in an epitaxial layer which is provided on a substrate which is of a conductivity type opposite to that of the said layer, the said isolation regions being of the same conductivity type as the substrate. In this case first deposits which are considerably doped and are of the same conductivity type as the substrate, are provided preferably on a surface of the substrate, which surface is then coated with the epitaxial layer after which on the free surface of the epitaxial layer on the one hand second deposits are provided which are of the same type as the first and correspond therewith and on the other hand local deposits are provided which are preferably of a material which is identical to that of the said first and second deposits which destined to form the emitters of the said second transistors, in which the first and second deposits are destined to form together the diffused isolation regions, after which the substrate, the epitaxial layer and the deposits are heated at the diffusion temperature of the said deposits. The said first and second deposits diffuse in the opposite directions in the epitaxial layer in which they form the isolation regions of the island, while the emitter regions are obtained by further diffusion of the local deposits.

The method according to the invention shows numerous advantages which contribute to increasing the gain of the transistor with diffused emitter and collector which, in the known devices, is weak as a result of its structure.

In fact, it is possible with the method according to the invention for the emitter of the transistor having a diffused emitter and collector to obtain a high impurity content which is much higher (or example, 100 times) than the impurity content of the collector region; it is known that such a difference in the inpurity content of the emitter and the collector increases the gain. In the above described prior art method, the emitter and collector which are manufactured simultaneously have identical impurity contents.

Since the emitter and the collector of the transistor having a diffused emitter and collector, are manufactured in two separate diffusion treatments, the distance between two regions may be small, difficulties which occur in simultaneously opening windows located close to each other in the oxide layer being avoided.

It is to be denoted that in the method according to the invention the various diffusion treatments for the emitter and the collector do not increase the total number of operations since the emitter is diffused simultaneously with the isolation regions. Preferably the isolation regions usually have a high impurity content.

In addition, in the method according to the invention, the diffusion of the emitter of the transistor having a diffused emitter and collector, continues, for a much longer period of time, since it begins with the isolation diffusion and continues during the subsequent diffusion treatments. Therefore the lateral diffusion of said regions is large as a result of which the distance from the emitter to the collector may be smaller and hence the gain is further improved.

The invention further relates to a monolithic semiconductor device manufactured by using a method according to the invention.

In order that the invention may be readily carried into effect, it will now be described in greater detail, by way of example, with reference to the accompanying drawings, in which FIGS. 1 to 7 show different stages in the manufacture of an integrated semiconductor device according to the method of the invention.

The monocrystalline semiconductor wafer 1 shown in FIG. 1, constitutes the substrate. This wafer is of the p-conductivity type but may equally be of the n-conductivity type, the conductivity type of each of the subsequent diffusion being then adapted in a corresponding and known manner.

In a given number of places of the surface F of the said said substrate 1 (see FIG. 2) deposits 2*a* of a strongly concentrated doping element are provided which are destined to form subsequently isolation regions of the same conductivity type as the substrate but with a high doping content which in the figures is denoted by p+. The deposits 2*a* have the shape on bands, which constitutes a checked pattern of the substrate.

Then (see FIG. 3) an epitaxial layer 3 having a conductivity type opposite to that of the substrate is provided on the same surface F of the substrate and on the deposits 2*a* in which subsequently circuit elements are provided.

At a given number of places of said layer 3, deposits 2*b* are then provided of the same doping element and in a concentration analogous to that of the deposits 2*a*. The deposits 2*b* are thus of the same type as the deposits 2*a* and in addition they correspond to the deposits 2*a*, that is to say, the deposits 2*b* lie exactly over the deposits 2*a*. Furthermore, at least one local deposit 4 of the p+-type which is destined to form the emitter of the transistor having a diffused emitter and collector is provided on the layer 3 (see FIG. 4).

The next step of the method according to the invention consists of a first diffusion treatment during which the deposits 2*a* and the deposits 2*b* form the isolation regions 6 which divide the epitaxial layer 3 into a number of islands 5*a*, 5*b*, . . . Simultaneously the deposit 4 is diffused and produces the strongly doped region 7. This region 7 is to form the emitter of the transistor having a diffused emitter and collector.

Figure 5A:
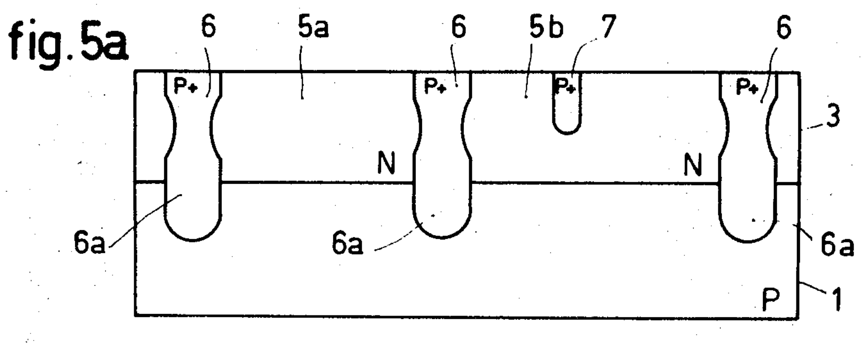
Figure 5B:
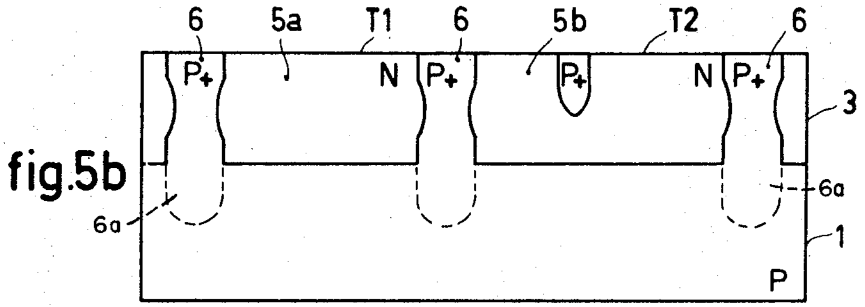

The structure of the wafer after this operation is shown in FIG. 5*a*, in which 6*a* denotes the diffusion front of the regions 6 in the substrate 1. FIG. 5*b* is identical to FIG. 5*a* but the diffusion fronts 6*a* are shown in dotted outline. These are also shown in dotted outline in FIGS. 6 and 7.

Figure 6:
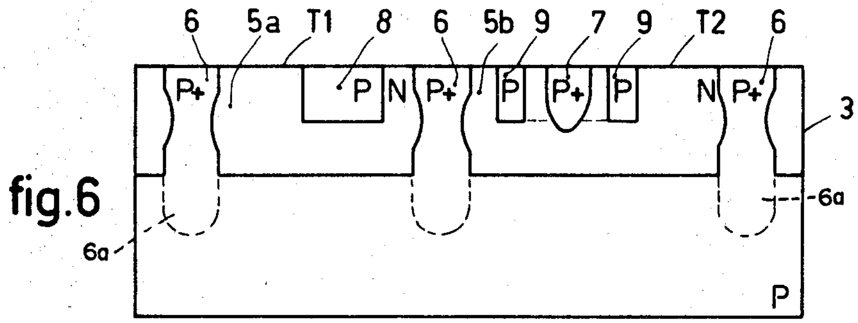
Figure 7:
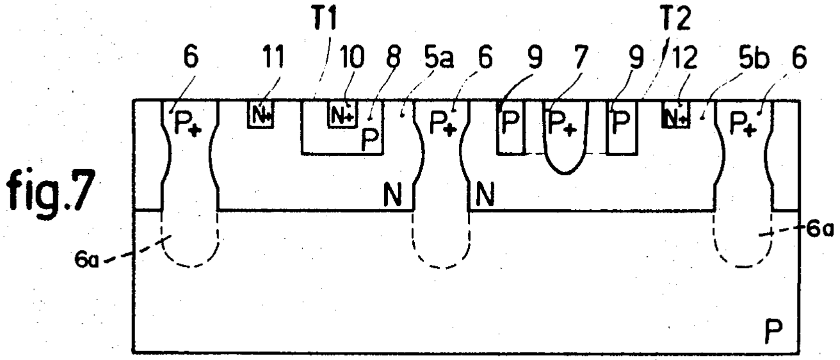

The next step consists of a second diffusion treatment to provide regions 8 and 9 of the same conductivity type as the regions 6 and 7 which, however, have a less high impurity content. FIG. 6 shows these regions. The region 8 produced in the island 5*a*, is destined as the base of the transistor $T_1$ having a diffused emitter and base. The annular region 9 in the island 5*b* which surrounds the emitter is to form the collector of the transistor 2 having a diffused emitter and collector.

A third diffusion treatment is then carried out during which regions of the same conductivity type as the epitaxial layer are produced which, however, have a high impurity content and are destined to form the emitter 10 of the transistor having a diffused base and emitter and the contacts 11 and 12 of the regions having the same conductivity type but a much lower doping content. The region 11 is the collector contact of the transistor having a diffused base and emitter, the region 12 is the base contact of the transistor having a diffused emitter and collector.

During the diffusion treatment, a masking a silicon oxide layer—not shown to avoid complexity of the drawing—is provided in a conventional manner.

Finally said silicon oxide layer is opened in which the contact places are exposed which are coated again with a conductive layer, for example, by metallization.

In this manner two complementary transistors are obtained. It is to be noted that in addition to the above described advantages, said method permits a better control of the transistor characteristics of the transistor having a diffused emitter and collector due to the separate diffusion treatments for the emitter and the collector. Naturally a larger number of complementary transistors may be provided.

The manufacture of the two transistors $T_1$ and $T_3$ will now be described in greater detail. It will be obvious that a larger number of transistors can be provided on one semiconductor wafer. Since the methods of masking, epitaxy and diffusion are generally known, no details are given.

This silicon wafer 1 (FIG. 1) is a monocrystalline substrate of the p-type having a resistivity of approximately 10Ω cm. and a thickness of approximately 100μ.

On the side of the surface F the boron deposits 2*a* (FIG. 2) are provided in known manner by prediffusion at a temperature of, for example, 1000° C. so as to obtain a strong surface concentration of the p+ type which concentration is equal to approximately $10^{20}$ at/cm.$^3$.

On the same surface F of the substrate 1, a silicon layer of the n-type having a thickness of 10 microns and a resistivity of approximately ½Ω cm. is provided in a conventional manner at a temperature of approximately 1200° C. This layer which is denoted by 3 in FIG. 3 constitutes the collector of the transistor $T_1$ and the base of the transistor $T_2$.

The boron deposits 2*b* are then provided on said layer 3 opposite to the deposits 2*a* by prediffusion in the same manner and with the same properties as the deposits 2*a*.

Figure 4:
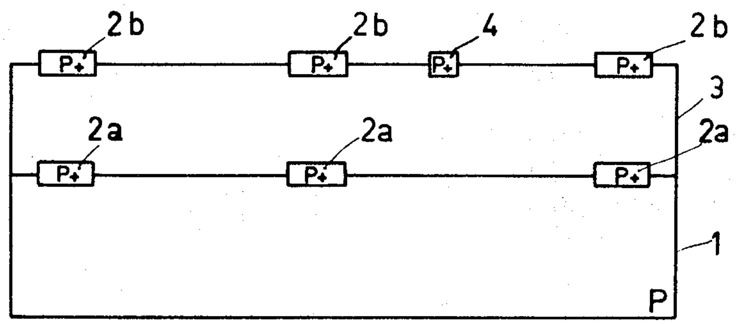

Simultaneously a local deposit 4 is provided which is destined to constitute the emitter 7 of the transistor $T_2$. These deposits 2*b* and 4 which are strongly p+ doped are shown in FIG. 4.

Subsequently a first diffusion treatment is carried out at a temperature of 1200° C. in a neutral atmosphere. From the deposits 2*a* and 2*b* the isolation regions 6 are formed while the emitter 7 of the transistor $T_2$ is formed from the prediffused region 4. The regions 6 and 7 are strong p+ doped. The regions 6 have diffusion fronts 6*a* in the substrate 1. These diffusion fronts are shown in dotted outline in the following figures.

A prediffusion of boron is then carried out in a conventional manner at a temperature of 900° C. to form deposits of the p-type in which the surface concentration of the boron is approximately $10^{10}$ to $20^{19}$ at/cm.$^3$.

The prediffusion regions are not shown in the figure, but are located at such places as to form the regions 8 and 9 in FIG. 6 during the following treatment.

After this prediffusion treatment, a second diffusion treatment of the boron at a temperature of approximately 1200° C. is carried out as a result of which the regions 8 (base of transistor $T_1$) and 9 (collector of the transistor $T_2$) of the p-type are obtained which are much more weakly doped, for example, from $10^{18}$–$10^{19}$ at/cm.$^3$, than the regions 6 and 7, for example, from $10^{19}$–$10^{20}$ at/cm.$^3$, the ratio between the concentration of the impurities lying between 5 and 50. It is to be noted that the region 9 surrounds the region 7.

Finally, a prediffusion treatment is carried out with phosphorus at a temperature of 1100° C. to form deposits of the n+ type in which the phosphorus concentration is approximately $10^{22}$ at/cm.$^3$. After this prediffusion treatment the phosphorus is further diffused at a temperature above 1100° C. during a third diffusion treatment, so that the regions 10, 11, 12 (FIG. 7) are formed which are strongly n+ doped. The region 10 constitutes the emitter of the transistor $T_1$.

All the diffusion treatments are carried out in a conventional manner through windows in a silicon oxide layer.

To obtain contacts at the regions 7, 8, 9, 10, 11 and 12, windows in the oxide layer are provided for the last time, after which, in vacuo, aluminum is vapour-deposited on the whole surface of the assembly, the aluminum being then removed again with the exception of the places where the said contacts are to be formed. Naturally, many variations are possible without departing from the scope of this invention.

What is claimed is:

1. A method of manufacturing a monolithic-integrated semiconductor device comprising complementary transistors in islands isolated by isolation regions, comprising the steps of diffusing into a semiconductor body portion of one conductivity type impurities of the opposite-conductivity-forming-type to form isolation regions of said opposite conductivity type extending entirely through said body portion and defining islands of said one-type conductivity, simultaneously with the last isolation region diffusion step diffusing into at least one of the islands said opposite-type-conductivity-forming impurities to form a diffused emitter extending only partially within the body portion of a first transistor, thereafter diffusing into said one island said opposite-type-conductivity-forming impurities and also after the first transistor emitter diffusion diffusing into at least another of said islands said opposite-type impurities to form in the said one island a diffused collector of said first transistor and to form in the said other island a diffused base of a second complementary transistor, and also after the first transistor emitter diffusion diffusing one-conductivity-type impurities into said one island to form a contact region for the base of the first transistor and also into said other island to form a cntact region for the collector of the second transistor and also into a portion of the base in said other island to form an emitter region of the said second transistor.

2. A method of manufacturing a monolithic-integrated semiconductor device comprising complementary transistors in islands isolated by isolation regions, comprising the steps of diffusing into a semiconductor body portion of one conductivity type impurities of said opposite-conductivity-forming-type to form isolation regions of said opposite conductivity type extending entirely through said body portion and defining islands of said one-type conductivity, simultaneously with the last isolation region diffusion step diffusing into at least one of the islands said same opposite-type conductivity-forming impurities to form a diffused emitter extending only partially within the body portion of a first transistor, thereafter diffusing into said one island said opposite-type-conductivity-forming impurities and simultaneously therewith diffusing into at least another of said islands said same opposite-type impurities to form in the said one island a diffused collector of said first transistor and to form in the said other island a diffused base of a second complementary transistor, and thereafter diffusing one-conductivity-type impurities into said one island to form a contact region for the base of the first transistor and also into said other island to form a contact region for the collector of the second transistor and also into a portion of the base in said other island to form an emitter region of the said second transistor.

3. A method as set forth in claim 2 wherein separate electrical connections are made to the emitter, collector and base contact of the first transistor, and to the emitter, base and collector contact of the second transistor.

4. A method as set forth in claim 2 wherein the semiconductor body comprises a substrate having said opposite-type conductivity and on which an epitaxial layer having said one-type conductivity is deposited, all the diffusion steps involving introduction of impurities taking place in the epitaxial layer.

5. A method as set forth in claim 4 wherein prior to deposition of the epitaxial layer deposits of said opposite-type impurities to form the isolation regions are made on the substrate surface, and following the deposition of the epitaxial layer deposits of the same impurities are made on the epitaxial layer surface to form the isolation regions and the emitter of the first transistor.

6. A method as set forth in claim 2 wherein the concentration of opposite-type impurities to form the emitter of the first transistor is substantially greater than the concentration of opposite-type impurities to form the collector of the first transistor.

7. A method as set forth in claim 6 wherein the concentration ratio lies between 5 and 50.

References Cited

UNITED STATES PATENTS

| | | | |
|---|---|---|---|
| 3,260,902 | 7/1966 | Porter | 148—175UX |
| 3,327,182 | 6/1967 | Kisinko | 317—235-22.1UX |
| 3,335,341 | 8/1967 | Lin | 317—235-22.1UX |
| 3,379,584 | 4/1968 | Bean et al. | 148—175 |
| 3,380,153 | 4/1968 | Husher et al. | 148—175X |
| 3,395,320 | 7/1968 | Ansley | 317—235-22.1UX |
| 3,412,460 | 11/1968 | Lin | 148—175X |
| 3,421,205 | 1/1969 | Pollock | 148—175X |
| 3,450,959 | 6/1969 | Dale | 148—175X |
| 3,457,125 | 7/1969 | Keir | 148—187 |
| 3,460,006 | 8/1969 | Strull | 148—175X |

FOREIGN PATENTS

| | | | |
|---|---|---|---|
| 1,422,157 | 11/1965 | France | 317—235-22.1 |

ALLEN B. CURTIS, Primary Examiner

U.S. Cl. X.R.

148—187; 317—235

UNITED STATES PATENT OFFICE

CERTIFICATE OF CORRECTION

Patent No. 3576682 Dated April 27, 1971

Inventor(s) JEAN-CLAUDE FROUIN and MICHEL DE BREBISSON

It is certified that error appears in the above-identified patent and that said Letters Patent are hereby corrected as shown below:

Column 2, line 55, "or" should read --for--.

--.

Column 4, line 7, cancel "a" (second occurrence);

line 53, "strong" should read --strongly--;

line 60, "$10^{10}$ to $20^{19}$" should read --$10^{18}$ to $10^{1}$

Signed and sealed this 24th day of August 1971.

(SEAL)
Attest:

EDWARD M.FLETCHER,JR.
Attesting Officer

WILLIAM E. SCHUYLER, JR.
Commissioner of Patents